United States Patent
Chen et al.

(10) Patent No.: US 9,936,602 B2
(45) Date of Patent: Apr. 3, 2018

(54) SYSTEMS AND METHODS FOR CONFIGURING POWER SUPPLY UNIT

(71) Applicant: Quanta Computer Inc., Taoyuan (TW)

(72) Inventors: Chao-Jung Chen, Taoyuan (TW);
Chung-Kai Chen, Taoyuan (TW);
Chi-Fu Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/844,587

(22) Filed: Sep. 3, 2015

(65) Prior Publication Data

US 2017/0071073 A1    Mar. 9, 2017

(51) Int. Cl.
*H05K 7/16* (2006.01)
*H05K 5/00* (2006.01)
*H05K 7/14* (2006.01)
*G06F 1/18* (2006.01)

(52) U.S. Cl.
CPC ......... *H05K 7/1492* (2013.01); *G06F 1/189* (2013.01)

(58) Field of Classification Search
CPC .................. H05K 7/1492; G06F 1/189
USPC ................................. 361/724–727
See application file for complete search history.

(56) References Cited

U.S. PATENT DOCUMENTS

| 4,008,367 A * | 2/1977 | Sunderhauf | H01B 7/0275 |
| | | | 174/102 SC |
| 9,395,767 B2 * | 7/2016 | McCabe | G06F 1/187 |
| 9,474,181 B2 * | 10/2016 | Bailey | H05K 7/1492 |
| 2010/0110628 A1 * | 5/2010 | Barrenechea | G06F 1/183 |
| | | | 361/679.48 |
| 2011/0013348 A1 | 1/2011 | Seibold | |
| 2011/0255230 A1 * | 10/2011 | Mori | H05K 7/1492 |
| | | | 361/679.02 |
| 2012/0312934 A1 * | 12/2012 | Dai | H02G 11/006 |
| | | | 248/70 |
| 2013/0058028 A1 | 3/2013 | Lu | |
| 2014/0293523 A1 | 10/2014 | Jau et al. | |

(Continued)

FOREIGN PATENT DOCUMENTS

| CN | 101246382 A | 8/2008 |
| CN | 102999111 A | 3/2013 |
| TW | 419141 M | 12/2011 |

(Continued)

OTHER PUBLICATIONS

Taiwanese Office Action for Application No. 104141551, dated May 23, 2017, w/ First Office Action Summary.

*Primary Examiner* — Nidhi Thaker
(74) *Attorney, Agent, or Firm* — Nixon Peabody LLP; Eduardo J. Quinones; Zhou Lu

(57) ABSTRACT

Various embodiments of the present technology provide systems and methods for configuring a power supply unit (PSU) of a rack system. The rack system contains one or more nodes, each of which can has a first housing and a second housing. The first housing stores a power supply unit (PSU) that can be easily accessed by a technician or a user from a front of the rack system. The second housing stores a plurality of computer-readable memory devices and has a first portion and a second portion. The first housing is positioned in the front of the rack system and in a central portion of the rack system between the first portion and the second portion of the second housing.

8 Claims, 9 Drawing Sheets

(Top View)

(56) References Cited

U.S. PATENT DOCUMENTS

2015/0189787 A1* 7/2015 Bailey .................. H05K 7/1489
361/679.48

FOREIGN PATENT DOCUMENTS

| TW | 430794 M | 6/2012 |
| TW | 201421209 A | 6/2014 |
| TW | 201438555 A | 10/2014 |
| TW | 201534198 A | 9/2015 |

* cited by examiner

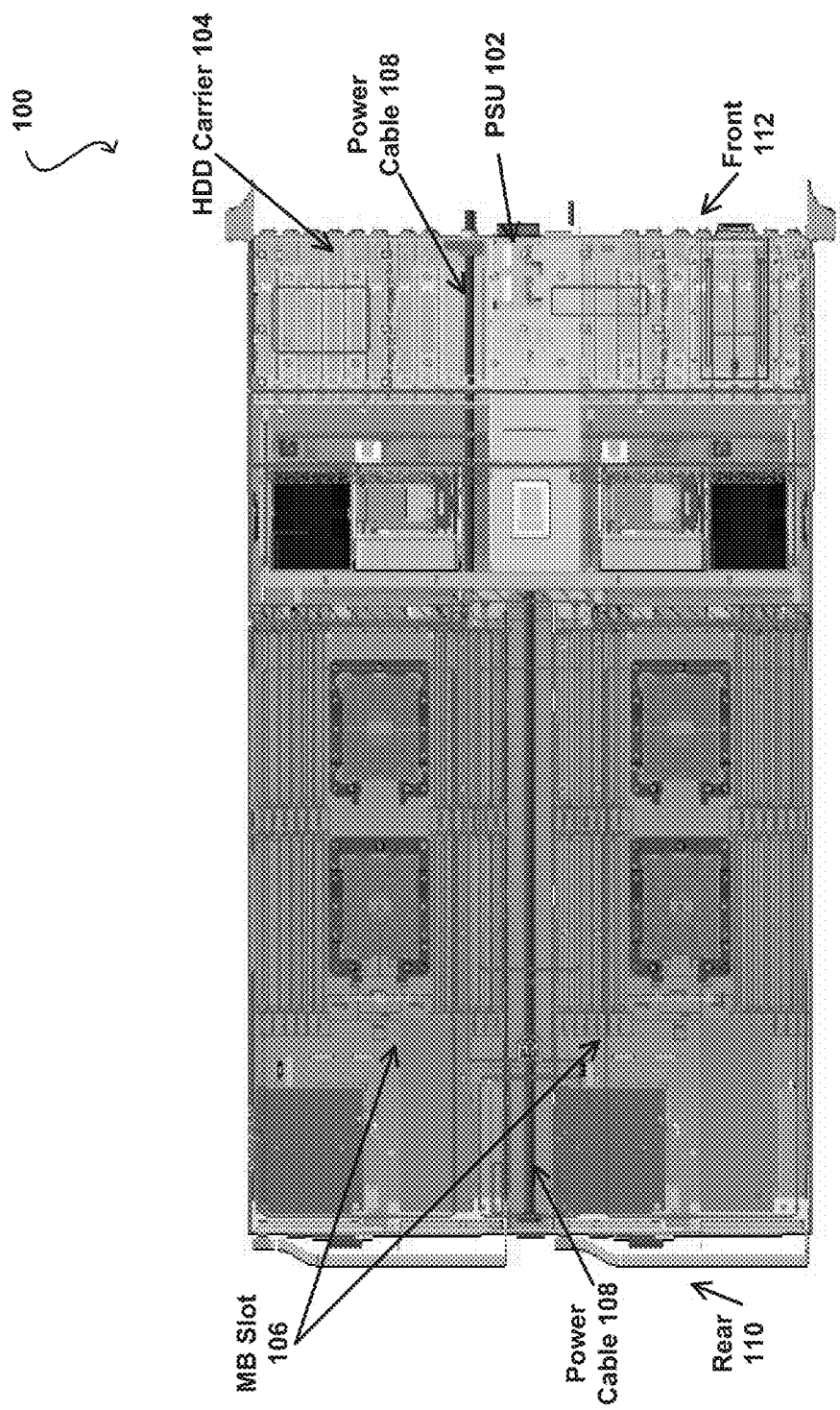
FIG. 1B (Top View)

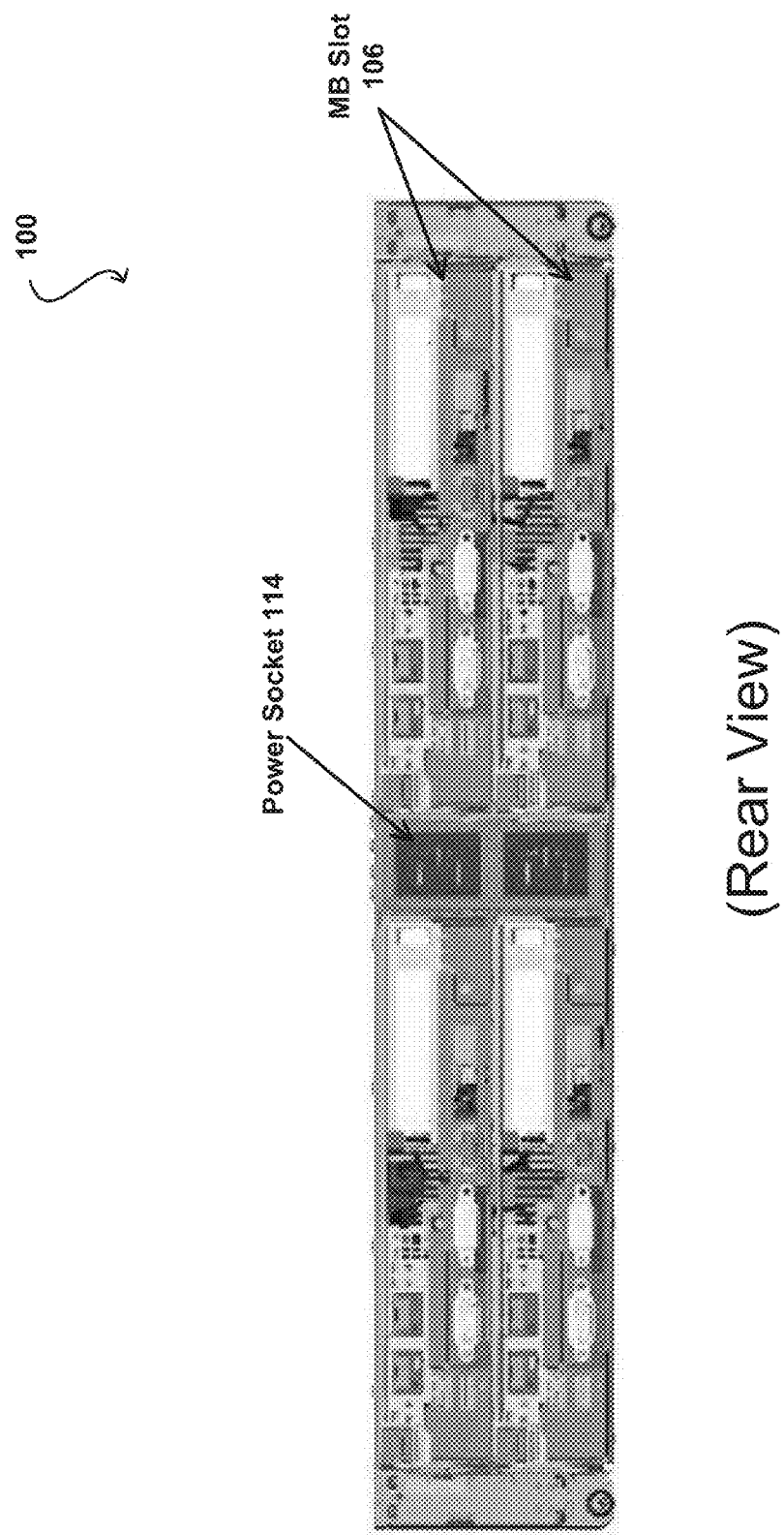
FIG. 1C (Rear View)

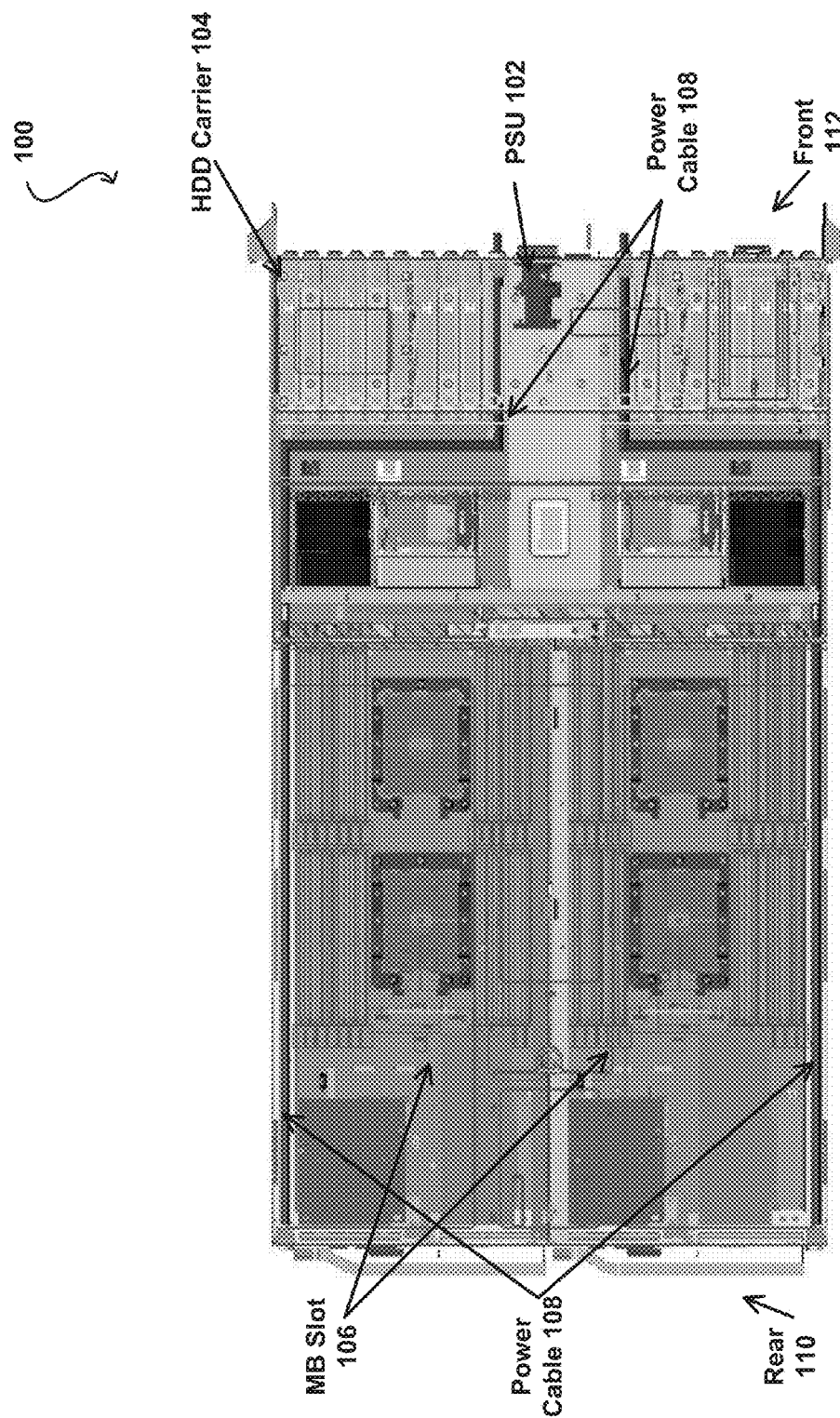
FIG. 1D (Top View)

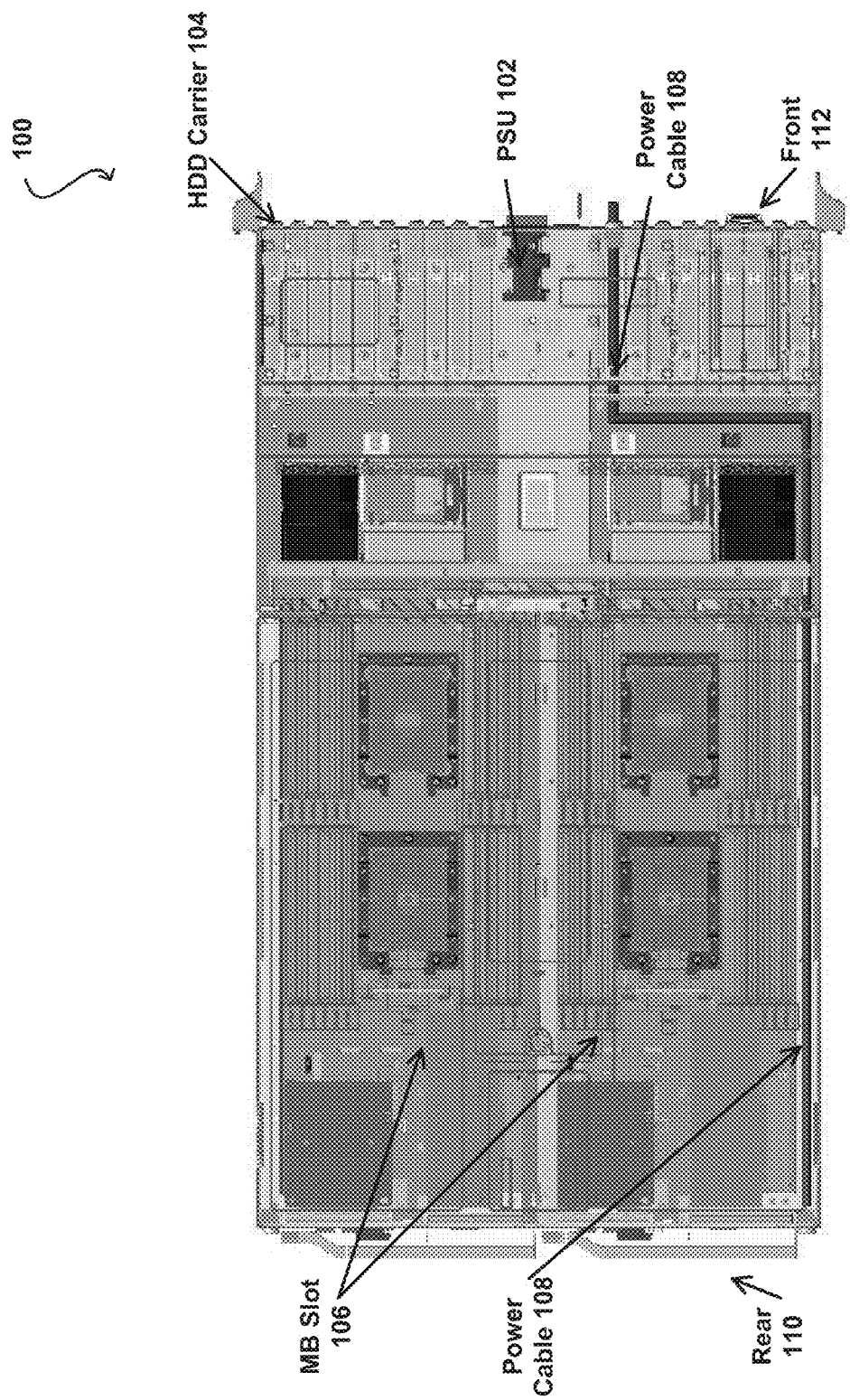
FIG. 1E (Top View)

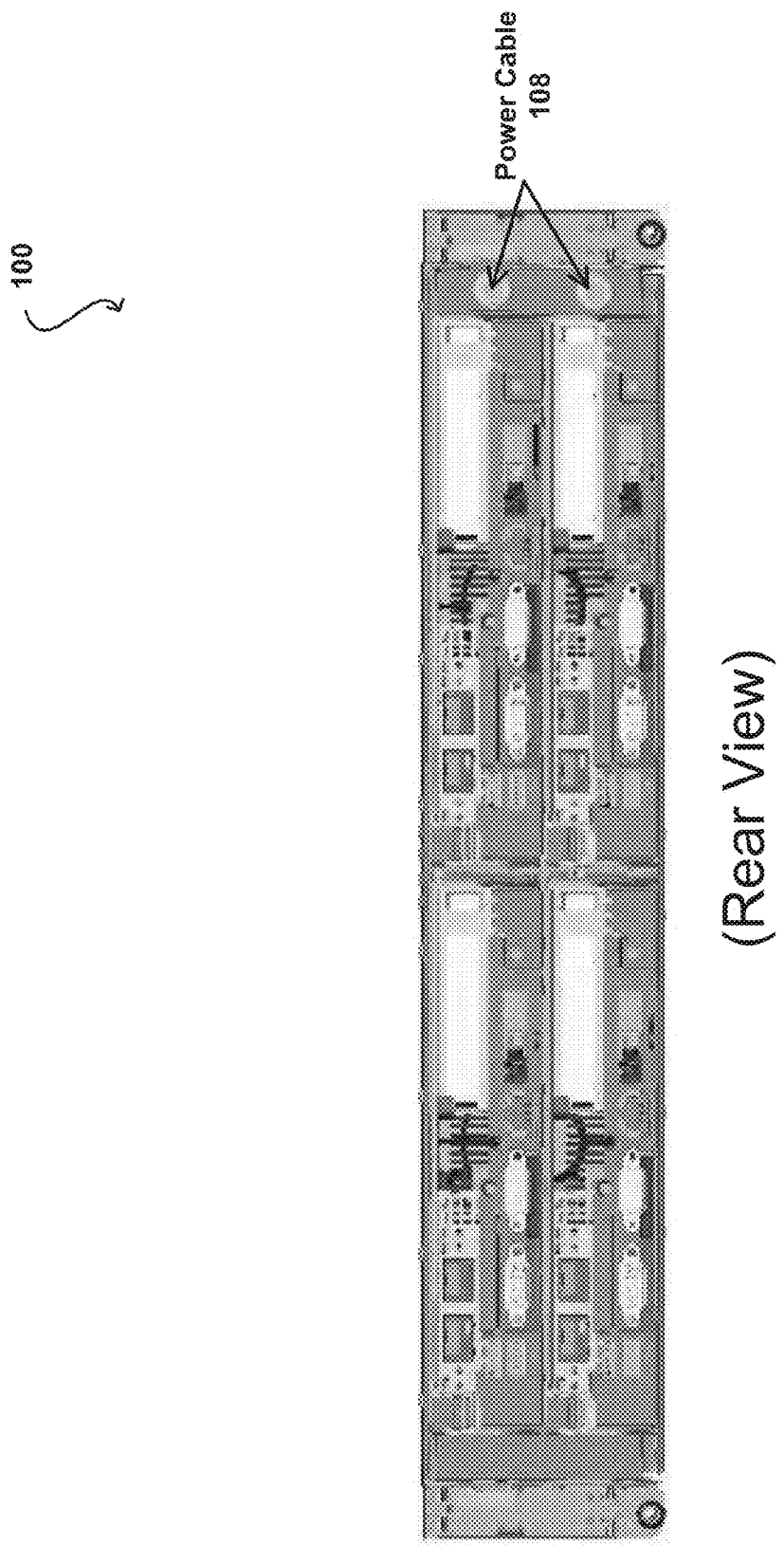
FIG. 1F (Rear View)

SYSTEMS AND METHODS FOR CONFIGURING POWER SUPPLY UNIT

TECHNICAL FIELD

The present technology relates generally to systems and methods for configuring a power supply unit in a rack system.

BACKGROUND

Modern server farms or datacenters typically employ a large number of servers to handle processing needs for a variety of application services. Each datacenter has a large number of power supply units (PSUs). Components of a PSU or an entire PSU may need to be repaired or replaced by a technician or user.

In the past, PSUs of a rack system in a datacenter are commonly mounted at a rear side of the rack system such that the PSUs can be easily connected to power distribution units (PDUs) installed at back pole(s) of the rack system. However, PSUs mounted at the rear side of the rack system can be difficult to be accessed.

Thus, there is a need to provide a system and method for configuring PSUs in a rack system without compromising the performance of the rack system (e.g., introducing thermal imbalance issues) such that the PSUs can be easily accessed by a user.

SUMMARY

Systems and methods in accordance with various embodiments of the present technology provide a solution to the above-mentioned problems by providing a mechanism for configuring a power supply unit (PSU) of a rack system. More specifically, various embodiments of the present technology provide a first housing and a second housing of a server system in the rack system such that a PSU stored in the first housing can be easily accessed by a technician or a user from a front of the rack system. The second housing can store a plurality of computer-readable memory devices and has a first portion and a second portion. The first housing is positioned in the front of the rack system and in a central portion of the rack system between the first portion and the second portion of the second housing.

In some embodiments, the rack system comprises a power distribution unit (PDU) that is mounted at a rear of the rack system. The PDU is connected to a power socket positioned in a central portion of the rear of the rack system. In some implementations, the power socket can be further positioned between two or more motherboard slots in the rack system. The rack system comprises a power cable that runs generally through a central position of the rack amount from a PSU positioned in a central position of a front of the rack system to the power socket. The PSU positioned in the central position can simplify thermal solutions in the rack system.

In some embodiments, the rack system contains a first power cable and a second power cable. The first power cable runs generally through a first side portion of the rack system from a first power socket positioned in the first side portion of the rear of the rack system to a PSU positioned in a central position of a front of the rack system. The second power cable runs generally through a second side portion of the rack system from a second power socket positioned in the second side portion of the rear of the rack system to the PSU. The first side portion and the second side portion are different sides of the rack system. For example, the first side portion can be opposite to the second side portion.

In some embodiments, the rack system contains one or more power cables. All of the one or more power cables run generally through a side portion of the rack system from one or more power sockets positioned in the side portion of the rear of the rack system to a PSU positioned in a central position of a front of the rack system.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only example aspects of the disclosure and are not therefore to be considered to be limiting of its scope, the principles herein are described and explained with additional specificity and detail through the use of the accompanying drawings in which:

FIGS. 1A, 1B and 1C illustrate schematic block diagrams of an exemplary server system of a rack system in accordance with an implementation of the present technology;

FIG. 1D illustrates a schematic block diagram of another exemplary server system of a rack system in accordance with implementations of the present technology;

FIGS. 1E and 1F illustrate schematic block diagrams of yet another exemplary server system of a rack system in accordance with implementations of the present technology;

DETAILED DESCRIPTION

Various embodiments of the present technology provide systems and methods for configuring a power supply unit (PSU) of a rack system. The rack system contains one or more nodes, each of which can has a first housing and a second housing. The first housing stores a power supply unit (PSU) that can be easily accessed by a technician or a user from a front of the rack system. The second housing stores a plurality of computer-readable memory devices and has a first portion and a second portion. The first housing is positioned in the front of the rack system and in a central portion of the rack system between the first portion and the second portion of the second housing.

Figure 1A:
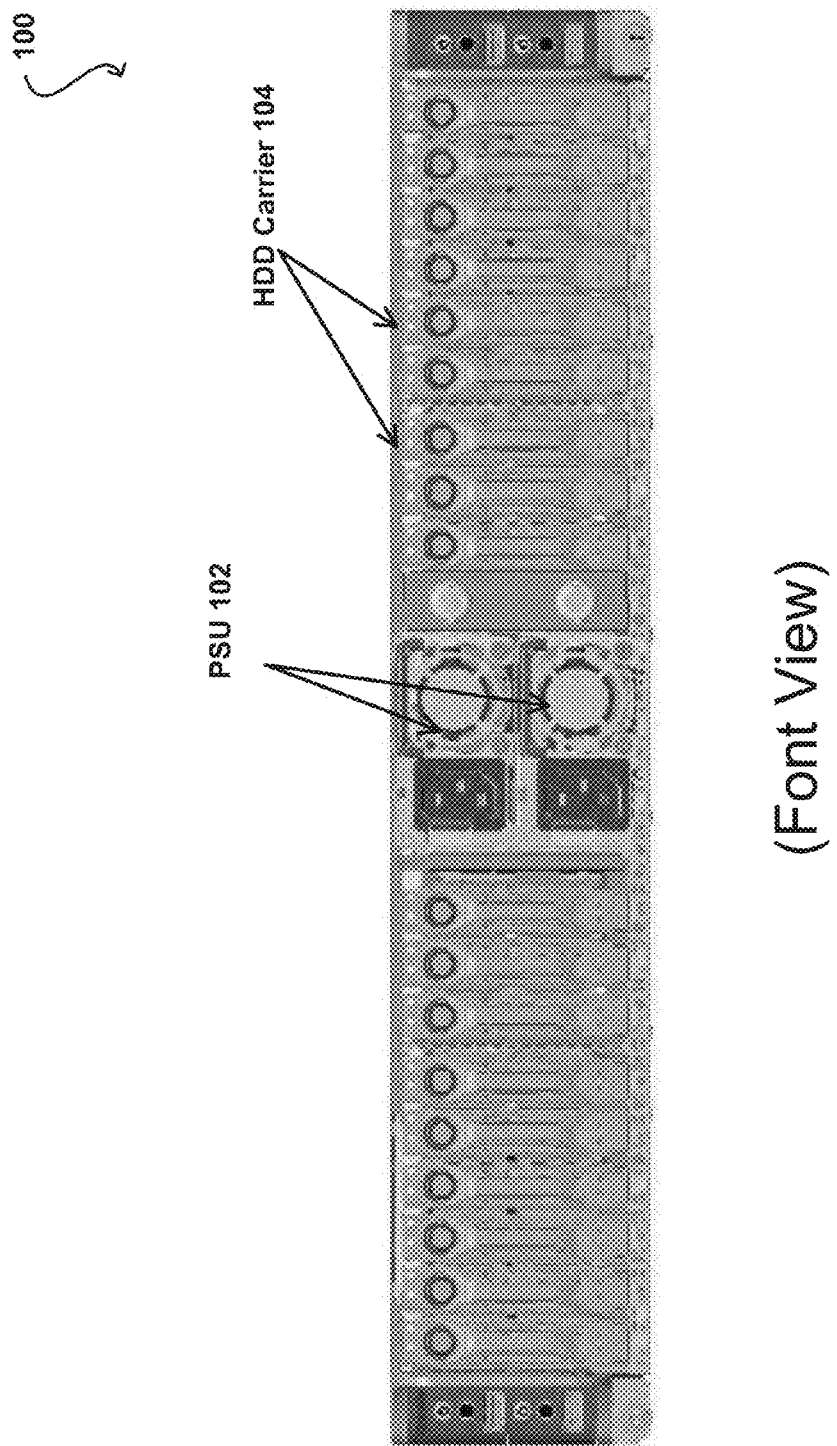

FIGS. 1A, 1B and 1C illustrate schematic block diagrams of an exemplary server system 100 of a rack system in accordance with an implementation of the present technology. In this example, the server system 100 comprises one or more PSUs (e.g., 102) positioned in a central position of a front 112 of the server system 100, and one or more computer-readable memory devices (e.g., hosted by HDD carriers 104). The server system 100 further includes at least one component board (e.g., a motherboard or a backplane board hosted by MB slots 106), and one or more power cables 108 that runs generally through a central portion of the server system 100 from the one or more PSUs 102 to a power socket 114 positioned in a central position of a rear 110 of the server system 100. Positioning the PSUs 102 in the central position of the rack system can resolve thermal imbalance issues in conventional server systems and simplify thermal solutions in the rack system.

In some implementations, the one or more power cables 108 can be a flexible power cable that includes an insulation and sheath layer. The flexible power cable is configured to withstand forces of repeated flexing and abrasion. The insulation and sheath layer can include a material from at least one of polyvinylchloride (PVC), fluoroethylenepropylene (PEP), or polytetrafluoroethylene (TFE). In some embodiments, a flexible power cord routing method can be used to connect a power distribution unit (PDU) (not shown) of the rack system to the power socket 114 positioned in the central position of therear 110 of the server system 100.

The PSUs 102 can convert an AC power supply to the server system 100 and provide power to various component (not shown) of the server system 100, such as at least one microprocessor or CPU, cache, NB logic, PCIe slots, Memory, SB logic (optional), ISA slots, PCI slots, a controller, and/or at least one memory, a sound card, a video card, a network card, and various other components. After being powered on, the server system 100 is configured to load software application from memory, computer storage device, or an external storage device to perform various operations.

In some implementations, the main memory of the server system 100 can be coupled to the CPU via a north bridge (NB) logic. A memory control module can be used to control operations of the memory by asserting necessary control signals during memory operations. The main memory may include, but is not limited to, dynamic random access memory (DRAM), double data rate DRAM (DDR DRAM), static RAM (SRAM), or other types of suitable memory.

In some implementations, the CPU can be multi-core processors, each of which is coupled together through a CPU bus connected to the NB logic. In some implementations, the NB logic can be integrated into the CPU. The NB logic can also be connected to a plurality of peripheral component interconnect express (PCIe) ports and a south bridge (SB) logic (optional). The plurality of PCIe ports can be used for connections and buses such as PCI Express×1, USB 2.0, SMBus, SIM card, future extension for another PCIe lane, 1.5 V and 3.3 V power, and wires to diagnostics LEDs on the server's chassis.

In some implementations, the NB logic and the SB logic of the server system 100 are connected by a peripheral component interconnect (PCI) Bus. The PCI Bus can support function on the CPU in a standardized format that is independent of any of CPU's native buses. The PCI Bus can be further connected to a plurality of PCI slots (e.g., a PCI slot). Devices connect to the PCI Bus may appear to a bus controller as being connected directly to a CPU bus, assigned addresses in the CPU's address space, and synchronized to a single bus clock. PCI cards can be used in the plurality of PCI slots include, but are not limited to, network interface cards (NICs), sound cards, modems, TV tuner cards, disk controllers, video cards, small computer system interface (SCSI) adapters, and personal computer memory card international association (PCMCIA) cards.

In some optional implementations, the SB logic (optional) can couple the PCI bus to a plurality of expansion cards or slots (e.g., an ISA slot) via an expansion bus. The expansion bus can be a bus used for communications between the SB logic and peripheral devices, and may include, but is not limited to, an industry standard architecture (ISA) bus, PC/104 bus, low pin count bus, extended ISA (EISA) bus, universal serial bus (USB), integrated drive electronics (IDE) bus, or any other suitable bus that can be used for data communications for peripheral devices.

In some implementations, the NB logic is further coupled to a controller that is connected to the at least one PSU. In some implementations, the controller can be a baseboard management controller (BMC), rack management controller (RMC), a keyboard controller, or any other suitable type of system controller. The controller is configured to control operations of the one or more PSUs and/or other applicable operations. In some implementations, the controller is configured to monitor processing demands, power consumptions, and components and/or connection status of the server system 100.

FIG. 1D illustrates a schematic block diagram of another exemplary server system 100 of a rack system in accordance with implementations of the present technology. In this example, the server system 100 comprises a PSU 102 positioned in a central position of a front 112 of the server system 100, and one or more computer-readable memory devices (e.g., hosted by HDD carriers 104). The server system 100 further includes at least one component board (e.g., a motherboard or a backplane board hosted by MB slots 106), and two power cables 108. One of the two power cables 108 runs generally through a first side portion of the server system 100 from a first power socket (not shown) at the first side portion of the server system 100 to the PSU 102. The other one of the two power cables 108 runs generally through a second side portion of the server system 100 from a second power socket (not shown) at the second side portion of the server system 100 to the PSU 102. In some implementations, the first side portion is opposite to the second side portion.

FIGS. 1E and 1F illustrate schematic block diagrams of yet another exemplary server system 100 of a rack system in accordance with implementations of the present technology. In this example, the server system 100 comprises one or more PSUs 102 positioned in a central position of a front 112 of the server system 100, and one or more computer-readable memory devices (e.g., hosted by HDD carriers 104). The server system 100 further includes at least one motherboard (e.g., hosted by MB slots 106), and one or more power cables 108. All of the one or more power cables 108 run generally through a side portion of the server system 100 from one or more power socket (not shown) at the side portion of a rear of the server system 100 to the one or more PSUs 102. The one or more power sockets are connected to a PDU positioned at a rear of the rack system. Since the one or more power socket are all configured at the side portion of the rear of the server system 100, an easy routing to the PDU of the rack system can be achieved.

Although only certain components are shown within the server system 100 in FIGS. 1A-1F, various types of electronic or computing components that are capable of processing or storing data, or receiving or transmitting signals can also be included in the server system 100. Further, the electronic or computing components in the server system 100 can be configured to execute various types of application and/or can use various types of operating systems. These operating systems can include, but are not limited to, Android, Berkeley Software Distribution (BSD), iPhone OS (iOS), Linux, OS X, Unix-like Real-time Operating System (e.g., QNX), Microsoft Windows, Window Phone, and IBM z/OS.

Depending on the desired implementation for in the server system 100, a variety of networking and messaging protocols can be used, including but not limited to TCP/IP, open systems interconnection (OSI), file transfer protocol (FTP), universal plug and play (UpnP), network file system (NFS), common internet file system (CIFS), AppleTalk etc. As would be appreciated by those skilled in the art, the server system 100 illustrated in FIGS. 1A-1H are used for purposes of explanation. Therefore, a network system can be implemented with many variations, as appropriate, yet still provide a configuration of network platform in accordance with various embodiments of the present technology.

In exemplary configurations of FIGS. 1A-1F, the server system 100 can also include one or more wireless components operable to communicate with one or more electronic devices within a computing range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections, as known in the art.

One of ordinary skilled in the art will appreciate that in the server system 100 in FIGS. 1A-1F are for illustration purpose only. The server system 100 may include fewer or various other components and/or combinations are possible as well within the scope of various embodiments.

The above discussion is meant to be illustrative of the principles and various embodiments of the present technology. Numerous variations and modifications will become apparent once the above disclosure is fully appreciated.

Figure 2:
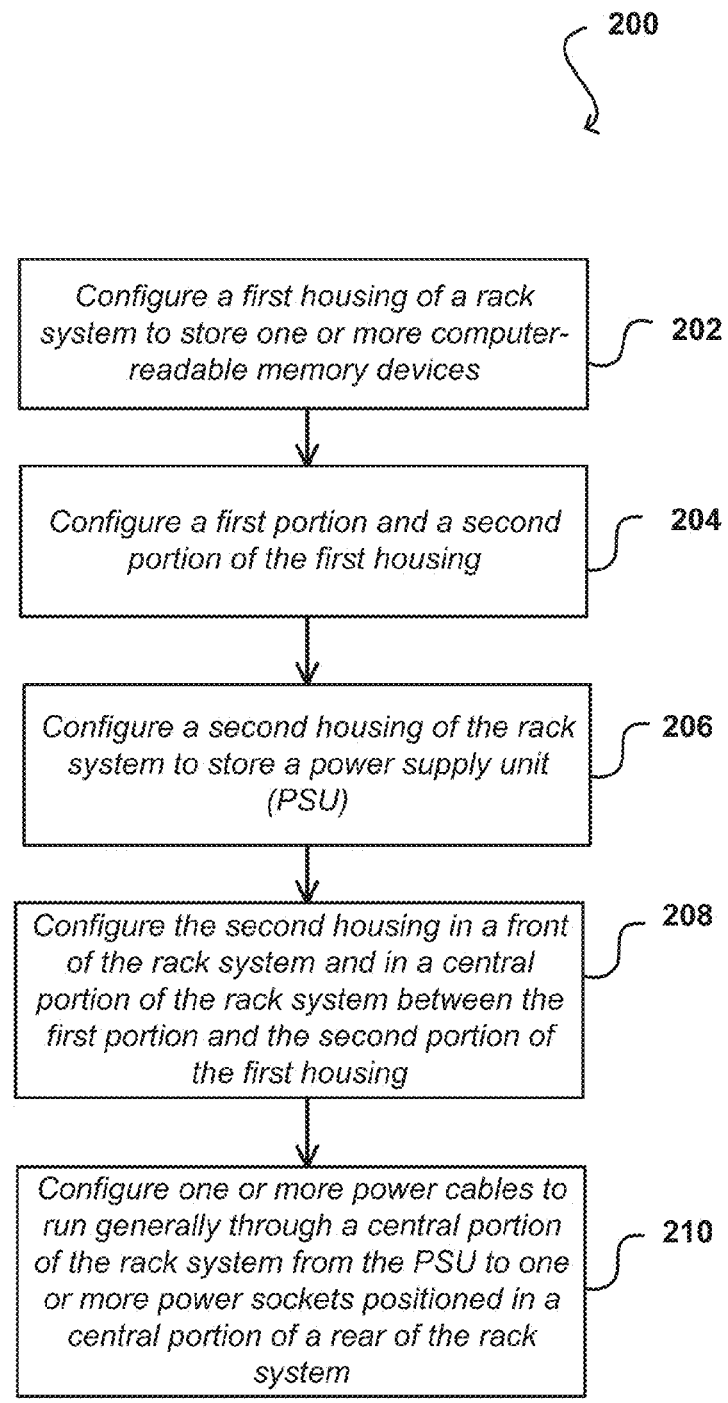
FIG. 2 illustrates an exemplary method of configuring a PSU in a rack system in accordance with implementations of the present technology.

FIG. 2 illustrates an exemplary method 200 of configuring a PSU in a rack system in accordance with implementations of the present technology. It should be understood that the exemplary method 200 is presented solely for illustrative purposes and that in other methods in accordance with the present technology can include additional, fewer, or alternative steps performed in similar or alternative orders, or in parallel. The exemplary method 200 starts with configuring a first housing a rack system to store one or more computer-readable memory devices, at step 202. The first housing may also be configured to host various components of the rack system, as illustrated in FIGS. 1A-1C. For example, the first housing can also be configured to host at least one microprocessor or CPU, cache, NB logic, PCIe slots, Memory, SB logic (optional), ISA slots, PCI slots, a controller, and/or at least one memory, a sound card, a video card, a network card, and various other components.

At step 204, a first portion and a second portion of the first housing can be configured. In some implementations, the first portion and the second of the first housing can be substantially symmetrical and used to host similar sets of components in the rack system, as illustrated in FIGS. 1A to 1F.

At step 206, a second housing of the rack system can be configured to store a power supply unit (PSU) of the rack system. In some embodiments, the PSU is positioned in a central position of a front of the rack system. In some implementations, the rack system can contain a plurality of PSUs.

At step 208, the second housing of the rack system can be positioned in a front of the rack system and in a central portion of the rack system between the first portion and the second portion of the first housing, examples of which are illustrated in FIGS. 1A, 1B, 1D and 1E.

The rack system can contain one or more power cables. At step 210, the one or more power cables can be configured to run generally through a central portion of the rack system from the PSU to one or more power sockets positioned in a central portion of a rear of the rack system, as illustrated in FIG. 1B. In some implementations, the power socket can be further positioned between two or more motherboard slots in the rack system.

In some embodiments, the rack system contains a first power cable and a second power cable. The first power cable runs generally through a first side portion of the rack system from a first power socket positioned in the first side portion of the rear of the rack system to the PSU of the rack system. The second power cable runs generally through a second side portion of the rack system from a second power socket positioned in the second side portion of the rear of the rack system to the PSU. In some embodiments, one or more power cables of the rack system run generally through a side portion of the rack system from one or more power sockets positioned in the side portion of the rear of the rack system to the PSU of the rack system.

Terminologies

A computer network is a geographically distributed collection of nodes interconnected by communication links and segments for transporting data between endpoints, such as personal computers and workstations. Many types of networks are available, with the types ranging from local area networks (LANs) and wide area networks (WANs) to overlay and software-defined networks, such as virtual extensible local area networks (VXLANs).

LANs typically connect nodes over dedicated private communications links located in the same general physical location, such as a building or campus. WANs, on the other hand, typically connect geographically dispersed nodes over long-distance communications links, such as common carrier telephone lines, optical lightpaths, synchronous optical networks (SONET), or synchronous digital hierarchy (SDH) links. LANs and WANs can include layer 2 (L2) and/or layer 3 (L3) networks and devices.

The Internet is an example of a WAN that connects disparate networks throughout the world, providing global communication between nodes on various networks. The nodes typically communicate over the network by exchanging discrete frames or packets of data according to predefined protocols, such as the Transmission Control Protocol/Internet Protocol (TCP/IP). In this context, a protocol can refer to a set of rules defining how the nodes interact with each other. Computer networks can be further interconnected by an intermediate network node, such as a router, to extend the effective "size" of each network.

Overlay networks generally allow virtual networks to be created and layered over a physical network infrastructure. Overlay network protocols, such as Virtual Extensible LAN (VXLAN), Network Virtualization using Generic Routing Encapsulation (NVGRE), Network Virtualization Overlays (NVO3), and Stateless Transport Tunneling (STT), provide a traffic encapsulation scheme which allows network traffic to be carried across L2 and L3 networks over a logical tunnel. Such logical tunnels can be originated and terminated through virtual tunnel end points (VTEPs).

Moreover, overlay networks can include virtual segments, such as VXLAN segments in a VXLAN overlay network, which can include virtual L2 and/or L3 overlay networks over which VMs communicate. The virtual segments can be identified through a virtual network identifier (VNI), such as a VXLAN network identifier, which can specifically identify an associated virtual segment or domain.

Network virtualization allows hardware and software resources to be combined in a virtual network. For example, network virtualization can allow multiple numbers of VMs to be attached to the physical network via respective virtual LANs (VLANs). The VMs can be grouped according to their respective VLAN, and can communicate with other VMs as well as other devices on the internal or external network.

Network segments, such as physical or virtual segments, networks, devices, ports, physical or logical links, and/or traffic in general can be grouped into a bridge or flood domain. A bridge domain or flood domain can represent a broadcast domain, such as an L2 broadcast domain. A bridge domain or flood domain can include a single subnet, but can also include multiple subnets. Moreover, a bridge domain can be associated with a bridge domain interface on a network device, such as a switch. A bridge domain interface can be a logical interface which supports traffic between an L2 bridged network and an L3 routed network. In addition, a bridge domain interface can support internet protocol (IP) termination, VPN termination, address resolution handling, MAC addressing, etc. Both bridge domains and bridge domain interfaces can be identified by a same index or identifier.

Furthermore, endpoint groups (EPGs) can be used in a network for mapping applications to the network. In particular, EPGs can use a grouping of application endpoints in a network to apply connectivity and policy to the group of applications. EPGs can act as a container for buckets or collections of applications, or application components, and tiers for implementing forwarding and policy logic. EPGs also allow separation of network policy, security, and forwarding from addressing by instead using logical application boundaries.

Cloud computing can also be provided in one or more networks to provide computing services using shared resources. Cloud computing can generally include Internet-based computing in which computing resources are dynamically provisioned and allocated to client or user computers or other devices on-demand, from a collection of resources available via the network (e.g., "the cloud"). Cloud computing resources, for example, can include any type of resource, such as computing, storage, and network devices, virtual machines (VMs), etc. For instance, resources can include service devices (firewalls, deep packet inspectors, traffic monitors, load balancers, etc.), compute/processing devices (servers, CPU's, memory, brute force processing capability), storage devices (e.g., network attached storages, storage area network devices), etc. In addition, such resources can be used to support virtual networks, virtual machines (VM), databases, applications (Apps), etc.

Cloud computing resources can include a "private cloud," a "public cloud," and/or a "hybrid cloud." A "hybrid cloud" can be a cloud infrastructure composed of two or more clouds that inter-operate or federate through technology. In essence, a hybrid cloud is an interaction between private and public clouds where a private cloud joins a public cloud and utilizes public cloud resources in a secure and scalable manner. Cloud computing resources can also be provisioned via virtual networks in an overlay network, such as a VXLAN.

Figure 3:
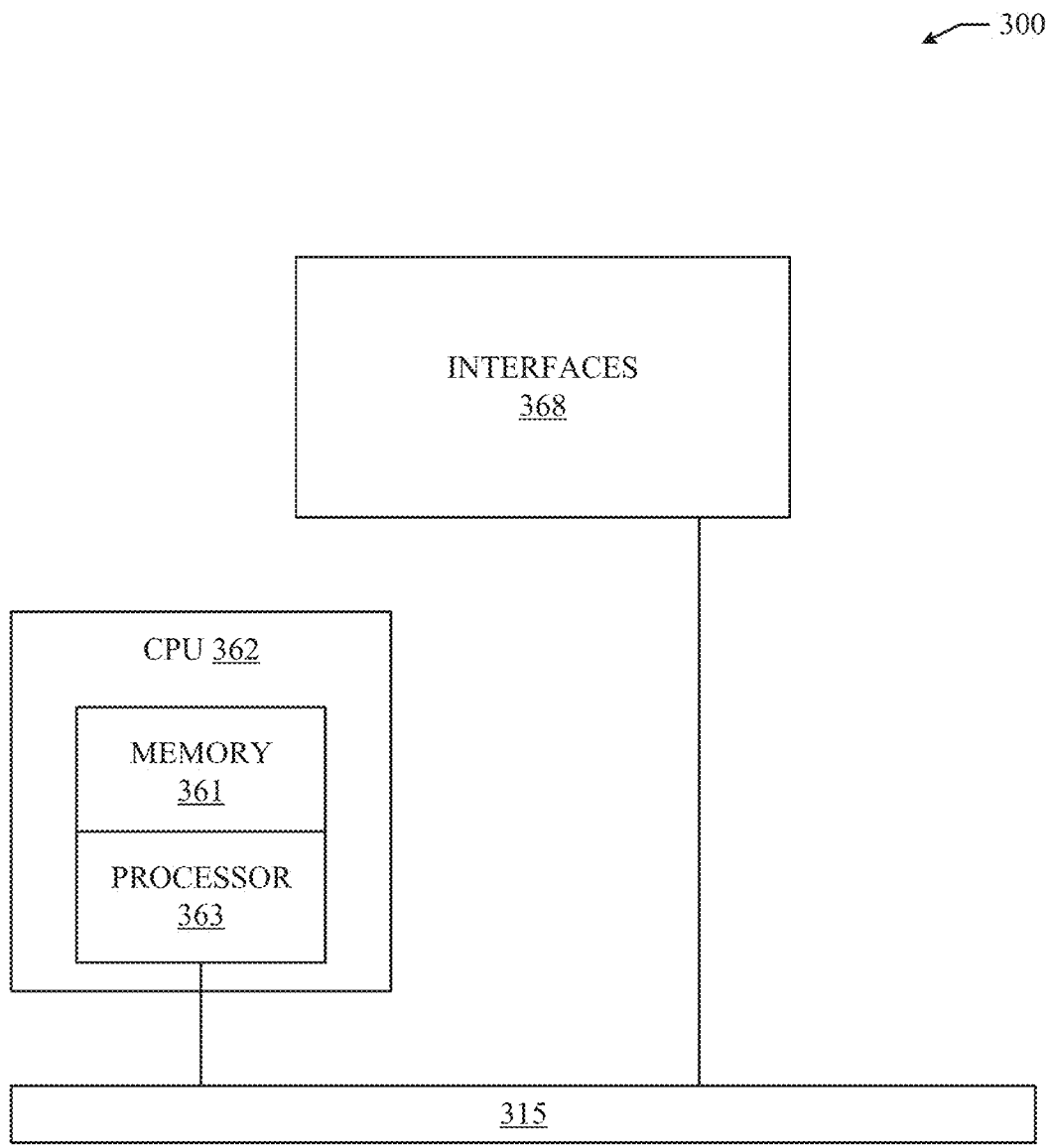
FIG. 3 illustrates an exemplary computing device in accordance with various implementations of the technology.

In a network switch system, a lookup database can be maintained to keep track of routes between a number of end points attached to the switch system. However, end points can have various configurations and are associated with numerous tenants. These end-points can have various types of identifiers, e.g., IPv4, IPv6, or Layer-2. The lookup database has to be configured in different modes to handle different types of end-point identifiers. Some capacity of the lookup database is carved out to deal with different address types of incoming packets. Further, the lookup database on the network switch system is typically limited by 1K virtual routing and forwarding (VRFs). Therefore, an improved lookup algorithm is desired to handle various types of end-point identifiers. The disclosed technology addresses the need in the art for address lookups in a telecommunications network. Disclosed are systems, methods, and computer-readable storage media for unifying various types of end-point identifiers by mapping end-point identifiers to a uniform space and allowing different forms of lookups to be uniformly handled. A brief introductory description of example systems and networks, as illustrated in FIGS. 3 and 4, is disclosed herein. These variations shall be described herein as the various examples are set forth. The technology now turns to FIG. 3.

FIG. 3 illustrates an example computing device 300 suitable for implementing the present technology. Computing device 300 includes a master central processing unit (CPU) 362, interfaces 368, and a bus 315 (e.g., a PCI bus). When acting under the control of appropriate software or firmware, the CPU 362 is responsible for executing packet management, error detection, and/or routing functions, such as miscabling detection functions, for example. The CPU 362 preferably accomplishes all these functions under the control of software including an operating system and any appropriate applications software. CPU 362 can include one or more processors 363 such as a processor from the Motorola family of microprocessors or the MIPS family of microprocessors. In an alternative embodiment, processor 363 is specially designed hardware for controlling the operations of the computing device 300. In a specific embodiment, a memory 361 (such as non-volatile RAM and/or ROM) also forms part of CPU 362. However, there are many different ways in which memory could be coupled to the system.

The interfaces 368 are typically provided as interface cards (sometimes referred to as "line cards"). Generally, they control the sending and receiving of data packets over the network and sometimes support other peripherals used with the computing device 300. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 362 to efficiently perform routing computations, network diagnostics, security functions, etc.

Although the system shown in FIG. 3 is one specific computing device of the present technology, it is by no means the only network device architecture on which the present invention can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 361) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 4A:
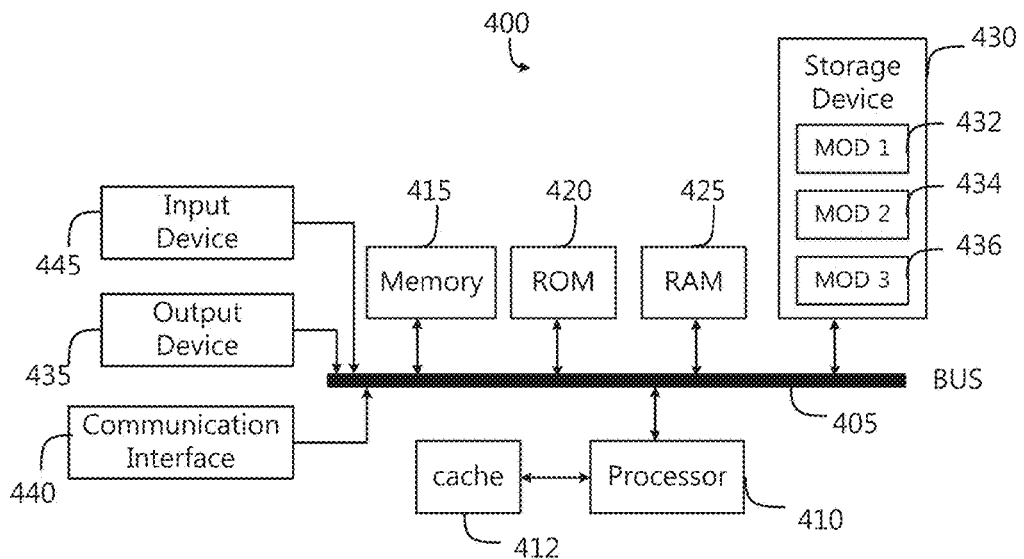
FIGS. 4A and 4B illustrate exemplary systems in accordance with various embodiments of the present technology.
Figure 4B:
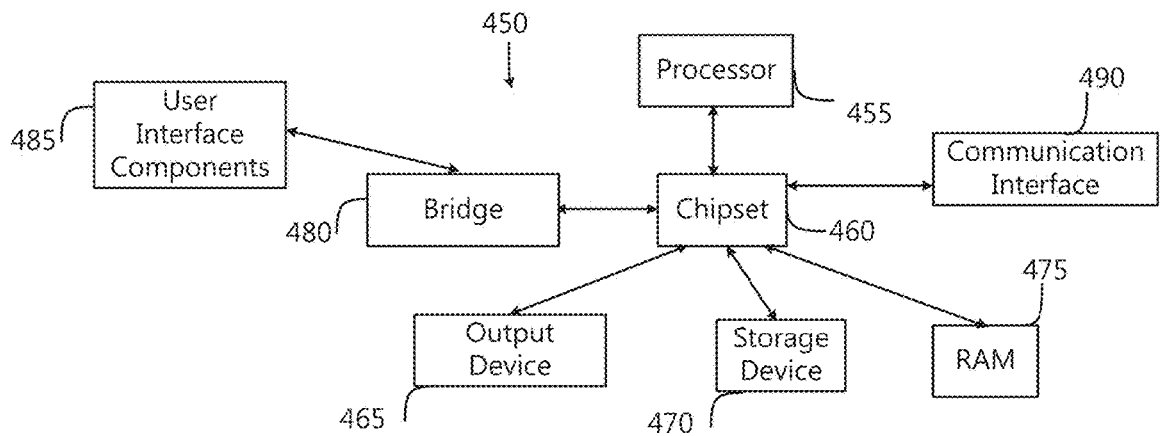

FIG. 4A, and FIG. 4B illustrate example possible systems in accordance with various aspects of the present technology. The more appropriate embodiment will be apparent to those of ordinary skill in the art when practicing the present technology. Persons of ordinary skill in the art will also readily appreciate that other system examples are possible.

FIG. 4A illustrates a conventional system bus computing system architecture 400 wherein the components of the system are in electrical communication with each other using a bus 405. Example system 400 includes a processing unit (CPU or processor) 410 and a system bus 405 that couples various system components including the system memory 415, such as read only memory (ROM) 420 and random access memory (RAM) 425, to the processor 410. The system 400 can include a cache of high-speed memory connected directly with, in close proximity to, or integrated as part of the processor 410. The system 400 can copy data from the memory 415 and/or the storage device 430 to the cache 412 for quick access by the processor 410. In this way, the cache can provide a performance boost that avoids processor 410 delays while waiting for data. These and other modules can control or be configured to control the processor 410 to perform various actions. Other system memory 415 can be available for use as well. The memory 415 can include multiple different types of memory with different performance characteristics. The processor 410 can include any general purpose processor and a hardware module or software module, such as module 432, module 434, and module 436 stored in storage device 430, configured to control the processor 410 as well as a special-purpose processor where software instructions are incorporated into the actual processor design. The processor 410 can essentially be a completely self-contained computing system, containing multiple cores or processors, a bus, memory controller, cache, etc. A multi-core processor can be symmetric or asymmetric.

To enable user interaction with the computing device 400, an input device 445 can represent any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems can enable a user to provide multiple types of input to communicate with the computing device 400. The communications interface 440 can generally govern and manage the user input and system output. There is no restriction on operating on any particular hardware arrangement and therefore the basic features here can easily be substituted for improved hardware or firmware arrangements as they are developed.

Storage device 430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 425, read only memory (ROM) 420, and hybrids thereof.

The storage device 430 can include software modules 432, 434, 436 for controlling the processor 410. Other hardware or software modules are contemplated. The storage device 430 can be connected to the system bus 405. In one aspect, a hardware module that performs a particular function can include the software component stored in a computer-readable medium in connection with the necessary hardware components, such as the processor 410, bus 405, output device 435 (e.g., a display), and so forth, to carry out the function.

FIG. 4B illustrates a computer system 450 having a chipset architecture that can be used in executing the described method and generating and displaying a graphical user interface (GUI). Computer system 450 is an example of computer hardware, software, and firmware that can be used to implement the disclosed technology. System 450 can include a processor 455, representative of any number of physically and/or logically distinct resources capable of executing software, firmware, and hardware configured to perform identified computations. Processor 455 can communicate with a chipset 460 that can control input to and output from processor 455. In this example, chipset 460 outputs information to output 465, such as a display, and can read and write information to storage device 470, which can include magnetic media, and solid state media, for example. Chipset 460 can also read data from and write data to RAM 475. A bridge 480 for interfacing with a variety of user interface components 485 can be provided for interfacing with chipset 460. Such user interface components 485 can include a keyboard, a microphone, touch detection and processing circuitry, a pointing device, such as a mouse, and so on. In general, inputs to system 450 can come from any of a variety of sources, machine generated and/or human generated.

Chipset 460 can also interface with one or more communication interfaces 590 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 455 analyzing data stored in storage 470 or RAM 475. Further, the machine can receive inputs from a user via user interface components 485 and execute appropriate functions, such as browsing functions by interpreting these inputs using processor 455.

It can be appreciated that example systems 400 and 450 can have more than one processor 410 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some examples, the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Various aspects of the present technology provide systems and methods for configuring a PSU in a rack system. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present invention can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technology can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

The server farm can include a variety of data stores and other memory and storage media as discussed above. These can reside in a variety of locations, such as on a storage medium local to (and/or resident in) one or more of the computers or remote from any or all of the computers across the network. In a particular set of examples, the information can reside in a storage-area network (SAN) familiar to those skilled in the art. Similarly, any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the invention as set forth in the claims.

What is claimed is:

1. A rack system for housing one or more servers, the rack system comprising:
a first housing associated with the rack system, the first housing storing a power supply unit (PSU);
a second housing having a first portion and a second portion, the second housing being associated with the rack system and storing at least one computer-readable memory device, wherein the first housing is positioned in a front of the rack system and in a central portion of the rack system between the first portion and the second portion of the second housing; and
a power distribution unit (PDU) connected to a power socket positioned in a central portion of a rear of the rack system, the power socket connected to a power cable that runs generally through a central portion of the rack system from the power socket to the PSU.

2. The rack system of claim 1, wherein the power cable is a flexible power cable that includes an insulation and sheath layer.

3. The rack system of claim 2, wherein the insulation and sheath layer includes a material from at least one of polyvinylchloride (PVC), fluoroethylenepropylene (PEP), or polytetrafluorethylene (TFE).

4. The rack system of claim 1, wherein the power socket positioned in the central portion of the rear of the rack system is positioned between two motherboard slots of the rack system.

5. A server system, comprising:
a first housing storing a power supply unit (PSU);
a second housing having a first portion and a second portion, the second housing storing at least one computer-readable memory device, wherein the first housing is positioned in a front of the server system and in a central portion of the server system between the first portion and the second portion of the second housing; and
a power socket positioned in a central portion of a rear of the server system, the power socket connected to a power distribution unit (PDU), wherein the power socket is connected to a power cable that runs generally through a central portion of the server system from the power socket to the PSU.

6. The server system of claim 5, wherein the power cable is a flexible power cable that includes an insulation and sheath layer.

7. The server system of claim 6, wherein the insulation and sheath layer includes a material from at least one of polyvinylchloride (PVC), fluoroethylenepropylene (PEP), or polytetrafluorethylene (TFE).

8. The server system of claim 5, wherein the power socket positioned in the central portion of the rear of the server system is positioned between two motherboard slots of the server system.

* * * * *